United States Patent [19]

Nath et al.

[11] Patent Number: 5,176,758
[45] Date of Patent: Jan. 5, 1993

[54] TRANSLUCENT PHOTOVOLTAIC SHEET MATERIAL AND PANELS

[75] Inventors: Prem Nath, Rochester Hills; Craig Vogeli, New Baltimore, both of Mich.

[73] Assignee: United Solar Systems Corporation, Troy, Mich.

[21] Appl. No.: 702,844

[22] Filed: May 20, 1991

[51] Int. Cl.⁵ .......................................... H01L 31/048
[52] U.S. Cl. ................................... 136/251; 136/244; 136/249; 136/256; 136/258; 437/2; 437/4
[58] Field of Search ....... 136/244, 251, 256, 258 AM, 136/249 TJ

[56] References Cited

U.S. PATENT DOCUMENTS

| | | | |
|---|---|---|---|
| 4,177,474 | 12/1979 | Ovshinsky | 357/2 |
| 4,178,415 | 12/1979 | Ovshinsky et al. | 428/446 |
| 4,339,255 | 7/1982 | Ovshinsky et al. | 65/32 |
| 4,485,125 | 11/1984 | Izu et al. | 427/74 |
| 4,609,771 | 9/1986 | Guha et al. | 136/249 |
| 4,642,413 | 2/1987 | Ovshinsky | 136/249 |
| 4,686,321 | 8/1987 | Kishi | 136/244 |
| 4,728,406 | 3/1988 | Banerjee et al. | 204/192.29 |
| 4,729,970 | 3/1988 | Nath et al. | 437/225 |
| 4,773,944 | 9/1988 | Nath et al. | 136/249 |
| 4,795,500 | 1/1989 | Kishi et al. | 136/244 |
| 4,816,082 | 3/1989 | Guha et al. | 136/249 |

FOREIGN PATENT DOCUMENTS

| | | | |
|---|---|---|---|
| 2-271681 | 11/1990 | Japan | 136/258 AM |
| 2-307278 | 12/1990 | Japan | 136/244 |
| PCT/US820-0961 | of 1982 | PCT Int'l Appl. | 136/244 |

OTHER PUBLICATIONS

M. Ohnishi et al, *Conference Record, 21st IEEE Photoroltaic Specialists Conference* (1990), pp. 1394–1399.

*Primary Examiner*—Aaron Weisstuch
*Attorney, Agent, or Firm*—Krass & Young

[57] ABSTRACT

A light transmissive power generating photovoltaic device (14) includes a power generating film having a substrate (30), a plurality of semiconductor layers (30, 32, 34) and a transparent conductive oxide layer (37) with a grid adhered on the top surface thereof. Apertures (42) pass through the opaque semiconductive layers to let light pass through. The power generating film is laminated onto a transparent glass sheet (24, 26) on each side to form the photovoltaic device.

8 Claims, 5 Drawing Sheets

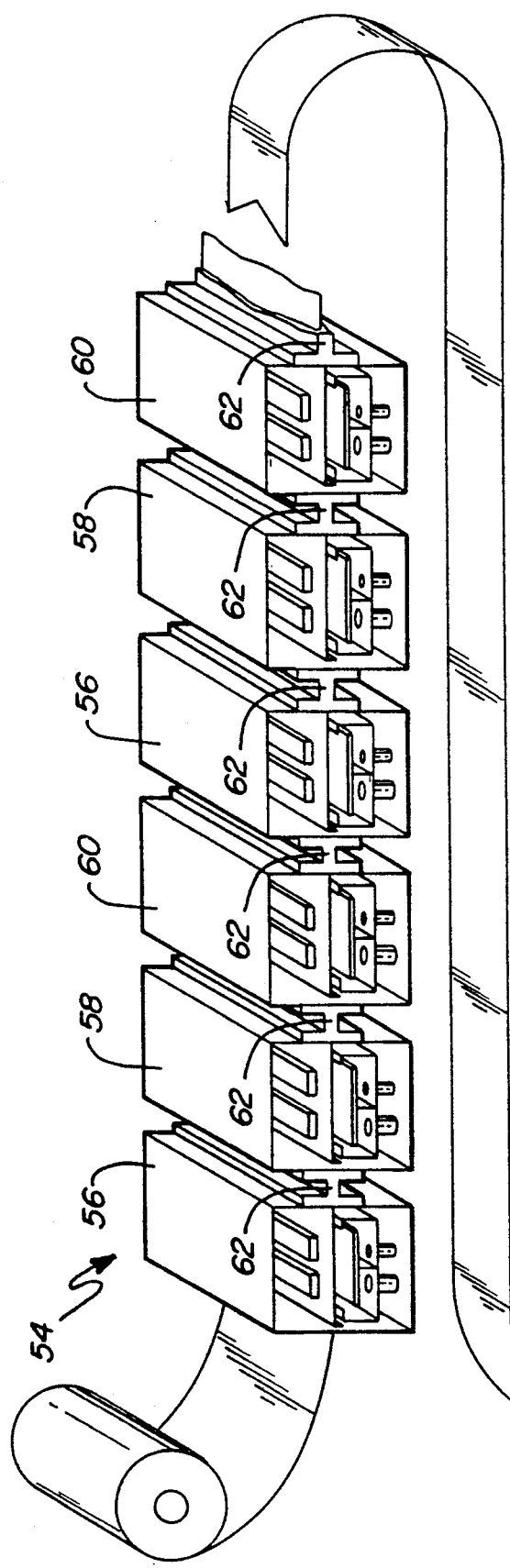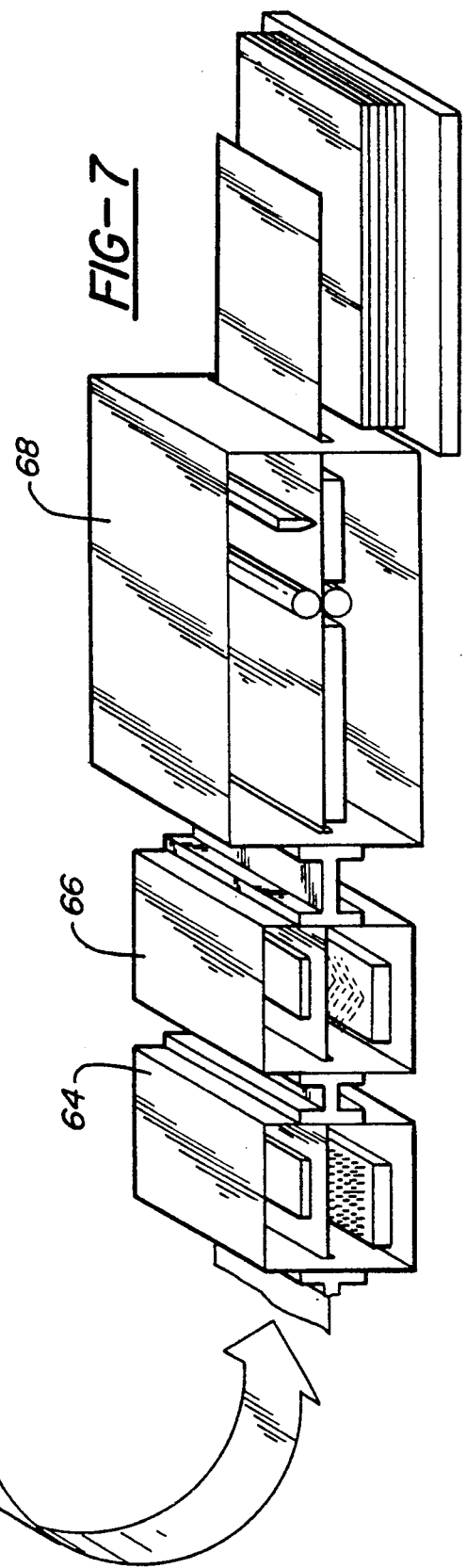
FIG-7

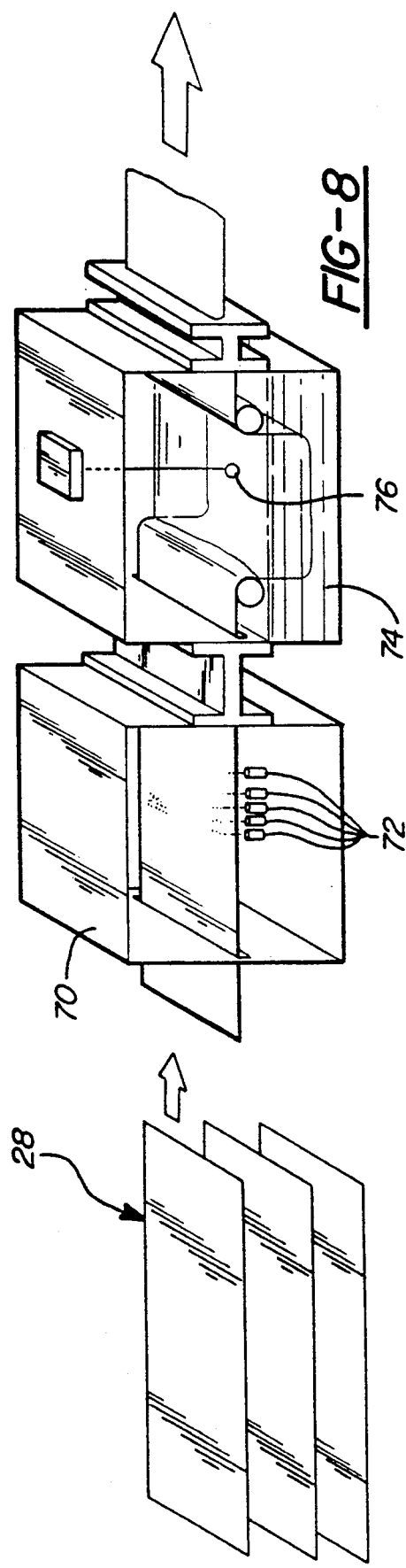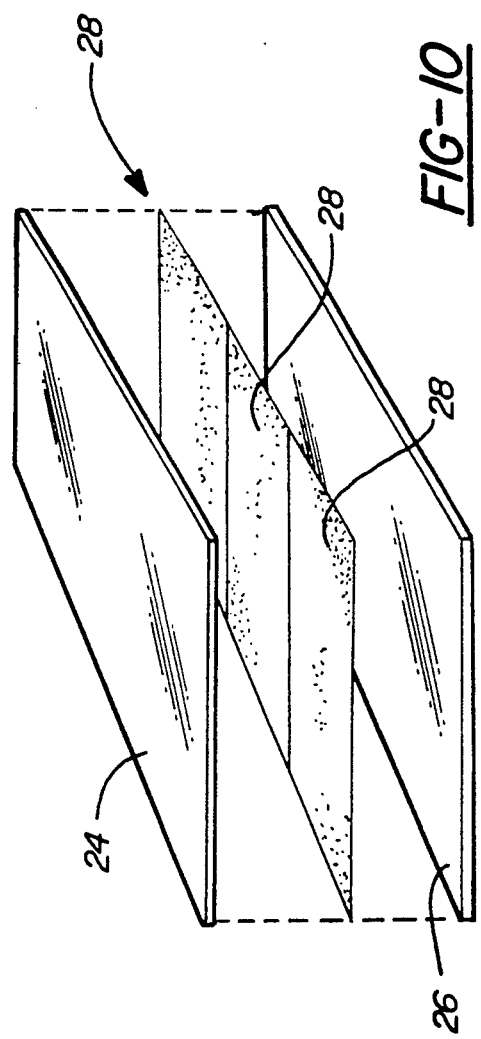

TRANSLUCENT PHOTOVOLTAIC SHEET MATERIAL AND PANELS

TECHNICAL FIELD

This invention relates generally to thin film semiconductor alloys and more particularly to an optically transmissive thin film semiconductor power generating sheet as well as photovoltaic devices made from optically transmissive power generating sheets.

BACKGROUND OF THE INVENTION

The increasing scarcity and the realization of ecological and safety problems associated with non-renewable energy reserves, such as coal, petroleum and uranium have made it apparent that it is essential that increased use be made of alternate non-depletable energy resources such as photovoltaic energy. Photovoltaic use has in the past been limited to special applications in part due to the high cost of manufacturing devices capable of producing photovoltaic energy. The development of a continuous process that continuously deposits successive layers of amorphous semiconductor alloy material on an elongated substrate to fabricate photovoltaic devices in mass production has greatly promoted the use of photovoltaic energy.

Recently, considerable efforts have been expended to develop systems and processes for preparing thin film amorphous semiconductor alloy materials which can be deposited so as to form p-type and n-type semiconductor alloy layers which can encompass relatively large areas for the production therefrom of thin film photovoltaic devices. It should be noted at this point that the term "amorphous" as used herein, is defined to include alloys or material exhibiting long range disorder, although said alloys or materials may exhibit short or intermediate range order or even contain crystalline inclusions.

In the economical continuous processing, a sheet of substrate material may be continuously advanced through a succession of operatively interconnected, environmentally protected deposition chambers, wherein each chamber is dedicated to the deposition of a specific layer of semiconductor alloy material onto the sheet or onto the previously deposited layer. For example, in making a solar cell of p-i-n type configuration, the first chamber is dedicated for depositing a p-type amorphous silicon semiconductor alloy, the second chamber is dedicated for the deposition of a layer of substantially intrinsic amorphous semiconductor alloy material and the third chamber is dedicated for depositing an n-type amorphous silicon semiconductor material. Because each deposited semiconductor alloy, and especially the intrinsic semiconductor alloy must be of high purity, the environment in the deposition chambers, particularly in the intrinsic deposition chamber, is isolated from the deposition constituents within the other chambers. The diffusion of the doping constituents from the p-type or n-type deposition chamber is halted and the contamination the intrinsic process gases in the intrinsic deposition chamber by dopant gases is prevented.

Thin film silicon and/or germanium alloy materials have found many applications from incorporation into calculators to large area grids for providing power to either homes, neighborhoods or even whole communities. The continuous deposition process has been used to produce many of these large area grids.

Transparent photovoltaic devices have been known for particular applications. These transparent devices are formed by placing extremely thin layers of semiconductor alloy material on a glass or transparent plastic or similar material with a first transparent electrode on each side of this semiconductor alloys to withdraw electrical current generated by the semiconductor alloys. These transparent electrodes in the past have been made from transparent conductive oxides. Alternatively, bus grids made from opaque material can also be used where the spaces between the bus grids provide for transparency through the photovoltaic device.

These transparent photovoltaic devices are often formed on a preformed and preshaped device, for example, a windshield or architectural plate glass which requires that the process of applying the thin film semiconductor layer on the substrate be a batch process with the substrate windshield etc. being moved from one deposition chamber to a sequential deposition chamber. The glass substrate needs to be appropriately masked beforehand. The opening of a deposition chamber to allow the movement of the preformed device to a sequential deposition chamber introduces the risk that contaminants may be in contact with the semiconductive alloy layers which can ruin the power generating aspect of the device. Furthermore, the batch process of depositing photovoltaic layers on a preformed transparent substrate is costly relative to the continuous process developed with thin sheets of material such as stainless steel.

There is a need for an optically transmissive photovoltaic device which incorporates a power generating sheet that is made with the known and cost-effective continuous deposition processes. Such devices would have wide application on car roofs and architectural glass where it is desired to have at least a portion of light that impinges on the photovoltaic devices to pass therethrough.

SUMMARY OF THE DISCLOSURE

In accordance with one aspect of the invention, a photovoltaic device includes a power generating sheet that has an electrically conductive substrate and a plurality of layers of semiconductive alloy material adhered onto a substrate to form at least one photovoltaic cell. An electrically conductive electrode is adhered to the top layer, i.e. top surface, of the semiconductive alloy material. A plurality of apertures pass through the power generating sheet to let a portion of light to pass therethrough. The power generating sheet is laminated to an optically transparent material such as, for example, glass or plastic. It is desirable that the plurality of apertures are sized to diffract most of the light that passes therethrough, thereby scattering the light and forming an optically transmissive device.

In one embodiment, the substrate is formed from a stainless steel material and is integrally formed with the first electrode. In this embodiment, the top electrode layer is made from a transparent conductive oxide and the apertures passing through the power generating sheet also pass through the first electrode. Preferably, the second electrode also includes a grid comprising strips of metallic material where the strips lie between the plurality of apertures.

In one embodiment the power generating sheet is laminated between two transparent sheets of material such that the power generating sheet is encapsulated and protected from ambient environment outside of the two sheets of transparent material. The transparent material may be rigid like glass or semi-rigid like plastic sheeting.

In accordance with another aspect of the invention, the power generating sheet of material includes a substrate layer having a first electrically conductive electrode and a plurality of photovoltaic semiconductor alloy layers forming a layered film having top and bottom surfaces that is capable of producing a voltage differential between the top surface and bottom surface. The bottom surface is connected to the substrate layer and the first electrode. A second electrode is electrically connected to the top surface of the semiconductor layered film. A plurality of apertures extend through the substrate and semiconductor layered film to let light pass therethrough. It is also desirable that the first electrode be integrally formed with the substrate by having the substrate made from electrically conductive material such as stainless steel. The apertures in one embodiment are sized to diffract light passing therethrough and scatter the light to form a translucent power generating sheet. In another embodiment the apertures are sized large enough to be visible and provide for undiffracted light to pass therethrough, thereby forming an image on the other side of the power generating sheet. In this embodiment, the power generating sheet has a screen-like transparent appearance.

In accordance with another aspect of the invention, a method of producing an optically transmissive photovoltaic device includes the steps of depositing an amorphous semiconductor alloy layered film on a substrate sheet having an electrode in contact with the bottom surface of the layered film. After deposition, a second electrode is connected to the upper surface of the layered film which is electrically isolated from the first electrode. A plurality of apertures is then formed through the substrate and the layered film to let light pass therethrough. Any short circuit connections between the electrodes are passivated via electrochemical methods after the formation of the apertures to form a photovoltaic power generating sheet. The power generating sheet is then laminated onto an optically transmissive sheet of material.

In accordance with another aspect of the invention, a method of producing an optically transmissive power generating sheet includes the steps of continuously moving an elongated substrate material having a first electrode through a series of isolated deposition chambers with each deposition chamber having means for adheringly depositing a layer of amorphous semiconductive alloy material thereon. Each sequential chamber deposits a layer of amorphous semiconducted alloy material that has an electrical characteristic different than the previously deposited layer. A series of isolation gates are located between the sequentially placed depositions for isolating the deposition chambers and gases in the adjacent deposition chambers. The elongated sheet passes through each of these isolation gate means. The series of deposition chambers forms an amorphous semiconductive layered film having a bottom surface and top surface that can generate a voltage potential therebetween when the top surface is exposed to electromagnetic radiation. A second electrode is adhered to the top surface while allowing the top surfaces of the semiconductive layer to remain visible and to be impinged by light to form an elongated power generating sheet. The elongated power generating sheet is continuously perforated to form apertures therethrough to allow light to pass therethrough. Apertures may be perforated in the sheet and positioned in cooperative relation with the upper electrodes, which may be strips of metal positioned between the apertures so as not to be shorted out or cut out from conducting generated electricity. Any short circuits between the first and second electrodes are passivated through electrochemical means to electrically isolate the first and second electrodes.

In accordance with still another aspect of the invention, a method of forming an optically transmissive photovoltaic device is characterized by the steps of depositing an amorphous semiconductor layered film on a substrate sheet having electrically conductive electrode in contact with the bottom surface of the layered film, connecting a second electrode to an upper surface of the semiconductor layered film, said second electrode being electrically isolated from the first electrode, and forming a plurality of apertures through the substrate sheet and layered film to let light pass therethrough. Any short circuit connections between the first and second electrodes after the formation of the apertures are passivated by electrochemical means to form a photovoltaic power generating sheet. The power generating sheet is then laminated onto an optically transmissive sheet of material.

BRIEF DESCRIPTION OF THE DRAWINGS

FIG. 7 is a schematic representation of a multiple chamber deposition system adapted to continuously deposit a plurality of successive thin film layers of semiconductor alloy material upon a continuously advancing substrate to form a power generating sheet;

FIG. 8 shows sequential steps in the method of converting the power generating sheet into a perforated and optically transmissive power generating sheet;

FIG. 10 shows the sequential steps of laminating the optically transmissive power generating sheet onto an optically transmissive substrate such as glass panels.

DETAILED DESCRIPTION OF THE PREFERRED EMBODIMENT

Figure 1:
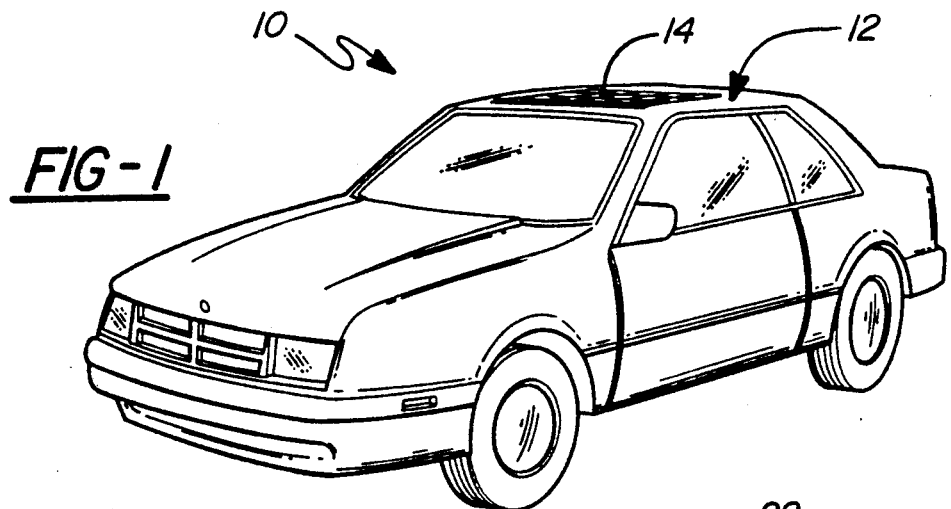
FIG. 1 discloses an automobile having a power generating sun roof according to one embodiment of the invention.

Referring to FIG. 1, an automobile 10 can have an optically transmissive roof 12. The optically transmissive roof 12 may be slidably openable or may be fixed. An optically transmissive section panel 14 of roof 12 generates electrical power via the photoelectric effect from light impinging thereon. The electrical power can be used to either trickle charge the automobile's battery when the car is off or to power a particular appliance in the automobile or to help to assist the alternator in generating electrical power needed for the automobile.

Figure 2:
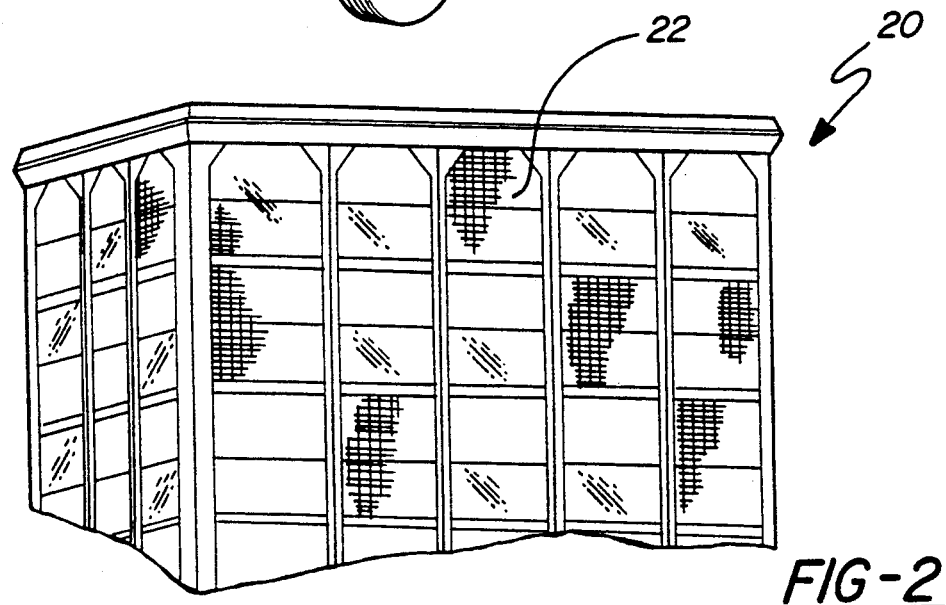
FIG. 2 illustrates a building sheathed in power generating glass according to another embodiment of the invention.

Another use for a power generating glass is shown in FIG. 2 which discloses a building 20 sheathed with panels 22 of power generating glass. The glass panels shown in FIGS. 1 and 2 are shown in more detail in FIGS. 3 and 4. The glass panel 14, for example, has two glass panes 24 and 26 which are optically transparent. If desired, the glass can be etched or tinted to be optically translucent. Of course it should be understood that each glass pane 24 and 26 may be laminated with plastic, heat-absorbing layers, or partially reflective layers which are not shown for simplicity of the drawing. A generating sheet 28 is laminated between the glass panes 24 and 26. The power generating sheet includes a substrate 30, a plurality of p type doped semiconductor alloy layers 32, a plurality of intrinsic semiconductor alloy layers 34, and a plurality of n type doped semiconductor alloy layers 36. For simplicity of drawing, only two of each layer are shown. Each p doped semiconductor layer 32, intrinsic semiconductor alloy layer 34 and n doped semiconductor alloy layer 36 forms a p-i-n photovoltaic cell, the successive p-i-n cells being stacked on top of each other to form tandem cells. The top n doped semiconductor alloy layer 36 has a transparent conductive oxide (TCO) layer 37 deposited thereon. An electrode grid 38 is adhered thereto. The grid 38 is made from strips 40 of electrically conductive metal connected to bus bars 39 as described in further detail later.

Figure 3:
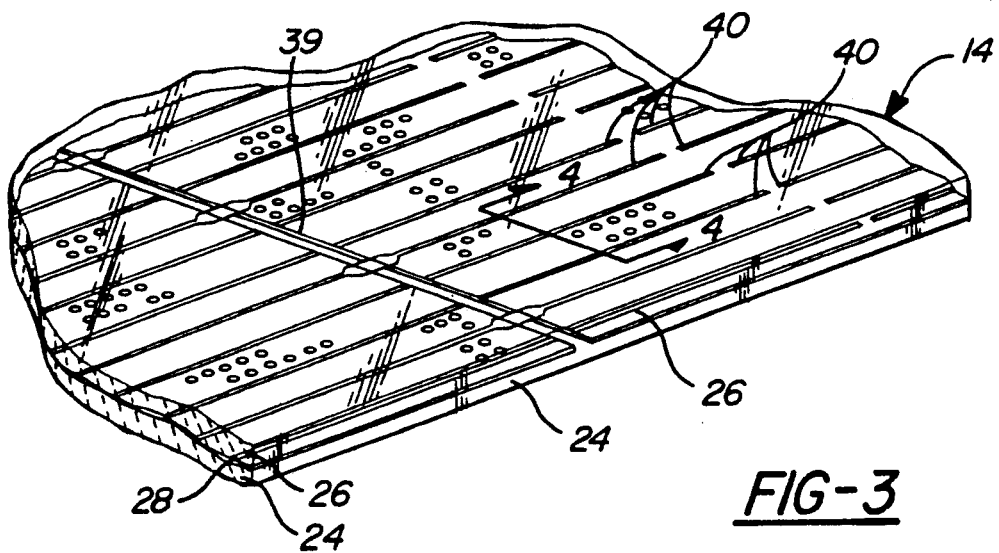
FIG. 3 is an enlarged top perspective view of the power generating glass shown in FIGS. 1 or 2.

The TCO layer 37 provides for conduction of electrical current to the grid strips 40 and bus bars 39 (FIG. 3). In certain applications, the grid 38 may not be necessary and the TCO layer 37 may form the second electrode in and of itself. The grid 38 is adapted to shorten the carrier path and increase the conduction efficiency of the second electrode.

Each of the p-i-n layers is fabricated with an amorphous or microcrystalline photovoltaic body containing at least a silicon alloy. Furthermore, it should be understood that although p-i-n photovoltaic cells are illustrated, the glass sheet is equally adapted for tandem n-i-p cells by simply reversing the order of the n- and p-layers that are deposited onto the substrate 30. Furthermore, for certain applications only p-n cells or Schottky barrier cells may be deposited onto the substrate 30. Each of the p-i-n layers is made from amorphous material or microcrystalline material which are well known in the art as materials that have no long range crystalline order.

It should be understood that the substrate 30 is made from stainless steel; however, it can also be made from other materials such as a non-conductive plastic with a transparent conductive metal oxide layer formed thereon, and optionally including an electrode grid.

A plurality of apertures 42 extend through the amorphous semiconductor alloy layers 32, 34, 36, TCO layer 37 and through substrate 30. The apertures 42 are positioned to be between the strips 40 and bus bars 39 of grid 38. Conversely, one can say that the grid 38 is positioned on the top surface of TCO layer 37 between the apertures 42.

The apertures 42 have a diameter sufficiently small to diffract light that passes therethrough. The smaller the aperture, the more diffraction occurs. Alternatively, in certain applications the apertures may be sized to be visible to the naked eye and provide for light to pass through undiffracted. When formed with such sized apertures, the power generating sheet 28 has a transparent screen-like appearance in which the light transmitted through the power screen can form an image on the other side.

The optics of diffraction holes are well known, and the diameters of the apertures have to be on the order of under a few light wavelengths to provide for a translucent optical effect with no image.

Density of the apertures can vary greatly depending on the amount of transmissivity desired. As is apparent, greater density of holes provides for a more transmissive power generating sheet 28. However, the more transmissive the sheet, the less the power per meter that can be generated therefrom. If, for example, apertures form 20% of the square area of the sheet, the transmissivity would be approximately 20% and the efficiency would be approximately 80% relative to a non-perforated power generating sheet. There is wide latitude in choice of density of apertures depending on the amount of power desired versus the amount of transmissivity desired.

Figure 4:
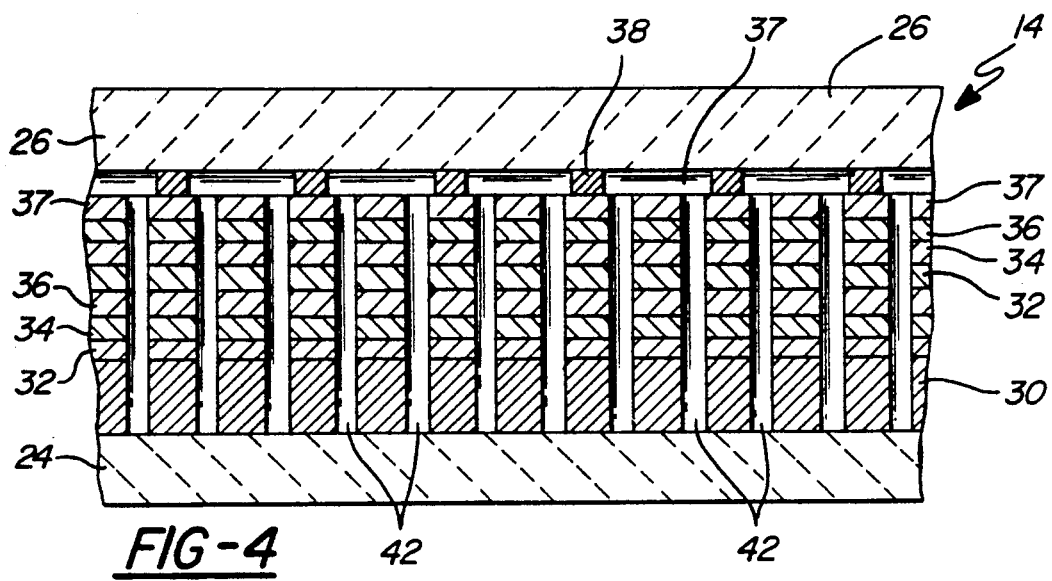
FIG. 4 is an enlarged cross-sectional view taken along the lines 4—4 in FIG. 3.

It should be understood that the drawings, particularly FIG. 4, are not drawn to scale. The relative thicknesses of the layers 32, 34, 36, and TCO layer 37 are minuscule compared to the thickness of substrate 30. For typical applications, substrate 30 is a stainless steel sheet of between 2–8 mils thickness and preferably 5 mils thickness. For practical applications, the total thickness of the power generating sheet 28 is not much greater than 2–3 mils thickness since the total thickness of the films 32, 34, 36, and conductive layer 37 is on the order of several microns.

Figure 5:
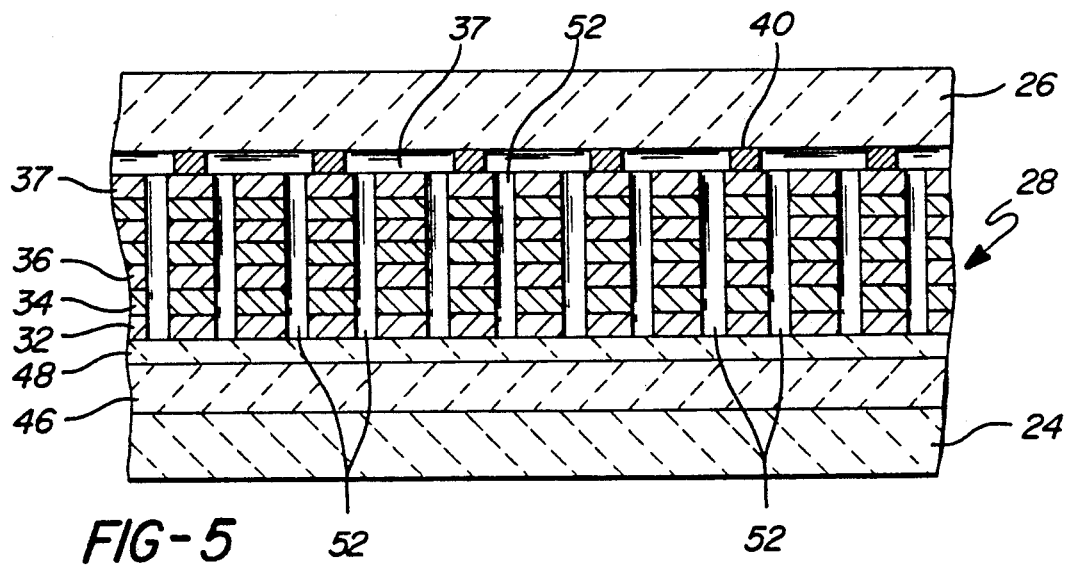
FIG. 5 is an enlarged cross-sectional view similar to FIG. 4 of a modified embodiment.

If a wider viewing angle is desired through the power generating sheet, the stainless steel substrate 30 can be substituted with a substrate 46 as shown in FIG. 5 which is made from a transparent resinous material. The first electrode is formed by a transparent conductive oxide layer 48 deposited on the resinous transparent substrate 46. Optional electrode strips of metallic material may be formed within the transparent conductive oxide layer 48. The layers 32, 34, and 36 are then deposited on the layer 48 in the same fashion as shown in FIG. 4. In addition, transparent conductive oxide second electrode layer 37 is deposited on the top layer 36 with the optional strips 40 adhered thereto.

Figure 6:
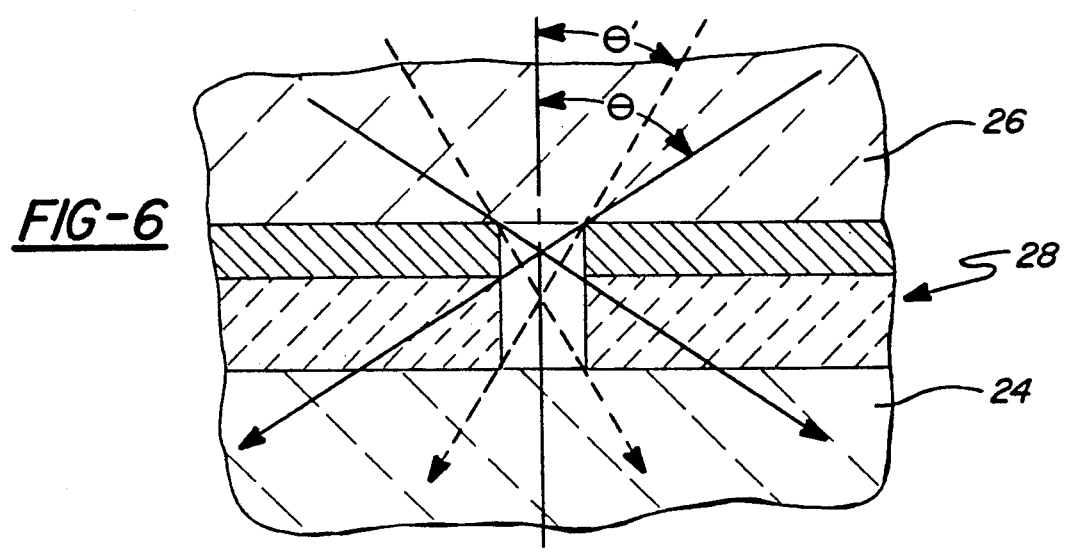
FIG. 6 is a diagrammatic view illustrating the angles through which light may pass in the two embodiments shown in FIGS. 4 and 5.

Holes 52 are etched through the transparent conductive oxide layer 37 and semiconductor alloy layers 32, 34 and 36. The holes 52 may be elongated widthwise to form a slot-like appearance in cross section. As shown in FIG. 6, for apertures 42 and holes 52 of equal diameter, the angle $\theta$ of incidence of light that can pass through the hole 52 is much greater than the angle $\theta'$ of incidence of light then can pass through aperture 42. In this way, the transparent substrate 46 allows for a greater angle through which to view the image formed by light passing through the power generating sheet.

Referring now to FIGS. 7, 8, 9 and 10, four diagrammatic representations of the method for producing laminated photovoltaic devices which are capable of transmitting light therethrough are illustrated. As shown in FIG. 7, a deposition apparatus 54 is illustrative of one type of glow discharge deposition system in which a plurality of isolated dedicated deposition chambers 56, 58 and 60 are interconnected via gas gates 62 to deposit the n-dopant semiconductor alloy layers, the intrinsic semiconductor alloy layers, and the p-dopant semiconductor alloy layers. As shown in FIG. 7, six stations are shown to form two n-i-p cells on top of each other (tandem). Of course, if further layers are desired, further deposition chambers need to be used beyond the six illustrated in FIG. 7. Deposition chambers 64 and 66 provide for deposition of the top transparent conductive oxide layer 37. These conductive oxide layers consist essentially of tin oxide, indium oxide, indium tin oxide, zinc oxide, cadmium stannate and combinations thereof.

The details of the deposition process of the semiconductor layers on the substrate are well known in the art due and are described in a number of patents assigned to Energy Conversion Devices, Inc., such as, for example, U.S. Pat. No. 4,609,771 to Guha, U.S. Pat. No. 4,485,125 to Izu et al. and U.S. Pat. No. 4,226,898 to Ovshinsky on Oct. 7, 1980 and U.S. Pat. No. 4,728,406 issued Mar. 1, 1988. These references are incorporated herein by reference. The gas gates 62 can have a variety of constructions of which two are illustrated in U.S. Pat. No. 4,450,786 to Doehler et al and U.S. Pat. No. 4,723,507 to Ovshinsky et al, issued on Feb. 9, 1988. These references are also incorporated herein by reference.

After deposition of the layers, the formed power generating sheet 28 leaves deposition chamber 66. At this point in time, the vacuum deposition process is over and the sheet can be withdrawn from the vacuum chambers and cut into desired lengths at cutting station 68 or rolled up into a roll for storage purposes.

The next step in the process is described with reference to FIG. 8 in which the power generating sheet 28 is fed through a station 70 which includes a plurality of lasers 72 that are constructed and positioned to focus a laser beam onto the sheet in order to pierce the plurality of aperture 42 through the sheet 28. Alternatively, mechanical means can be used to perforate apertures 42 through the sheet 28.

If the embodiment shown in FIG. 5 is made, the holes 52 may be etched or laser drilled so as to not to perforate the substrate. Other than not extending through the substrate, the holes 52 function identically to apertures 42, with the understanding that holes 52 may be substituted for apertures 42 when a transparent substrate is used.

The sheet is then passed through a short passivation chamber 74. The passivation process has previously been disclosed in detail in U.S. Pat. No. 4,729,970 issued Mar. 8, 1988, the disclosure of which is incorporated herein by reference. It is only necessary to point out that the current from electrode 76 produces a reaction in which the regions of the transparent conductive oxide immediately surrounding defects in the semiconductor alloy material are rendered electrically non-conductive and thereby passivated. This includes any defects that may exist around the peripheries of each aperture 42. Thereby the walls of each aperture 42 are assured not to cause a short circuit.

Figure 9:
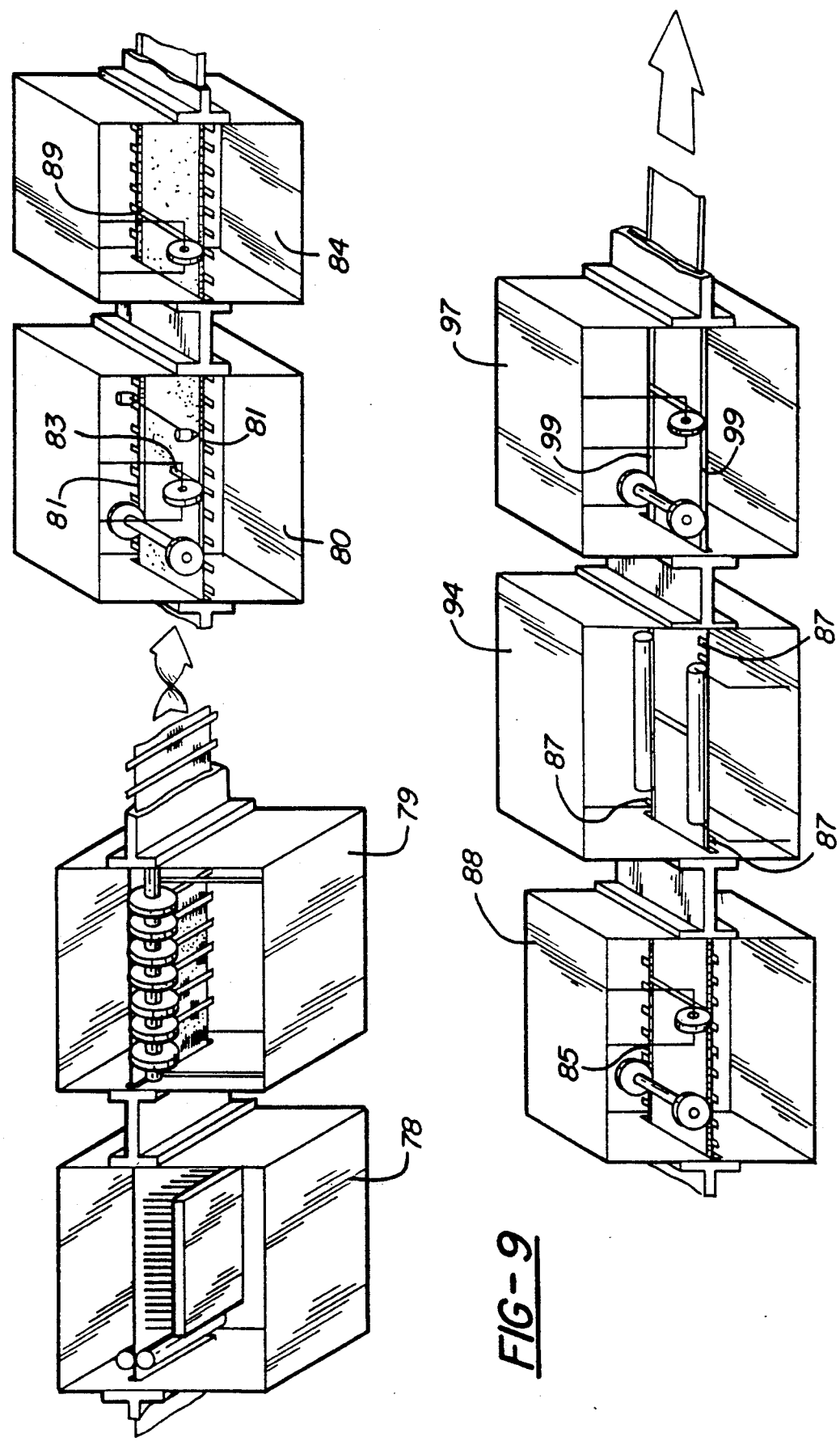
FIG. 9 shows the sequential steps of applying the grid and bus bars on the power generating sheet.

The power generating sheet 28 is further processed as shown in FIG. 9 which discloses a number of stations 78, 79, 80, 84, 88, 94 and 97 for providing a grid and bus bars on the power generating sheet for efficient conduction of electricity from the power generating sheet 28. The details of the grid printing and conductive bus bar strip attachment method are disclosed in U.S. Pat. No. 4,773,944 issued to Nath et al on Sep. 27, 1988, the disclosure of which is hereby incorporated by reference.

Suffice it to say that in station 78, the grid is printed onto the semiconductor alloy material with electrically conductive material such as silver paste. The path of the grid 38 can be contoured around each of the apertures 42 in circular or wave patterns. A plurality of substantially equally spaced relatively thin parallel electrically conductive rays or fingers 40 radiating perpendicular from both sides of a relatively thick electrical conductive bus bar 39 is well known in the prior art and can be accommodated with the present invention. At station 79 the thick electrical conductive bus bar 39 is attached in place on the substrate attached to the fingers 40 of the grid 38. Station 80 provides that a back bus bar 81 is attached to the uncoated substrate layer and terminal lead 83. A cross over bus bar 89 is applied to each edge of the bus bars 81 at station 84. Insulating tape 85 is then applied over the cross over members 81, terminal 83 and bus bars 89 in station 88. Station 94 performs the step of wrapping the ends 87 of strips 39 of the grid 38 over and around the power generating sheet onto the insulating tape 85. An electrically conductive material 99 is then positioned over the insulating tape to abut the end contacts of the strips 40 at station 97. At this point the power generating sheets are finished product and are sized in the standard 4'×1' dimensions.

Reference now is made to FIG. 10 in which one or more of these power generating sheets 28 can be arranged side by side and operably attached to each other in standard fashion and then laminated between two layers of glass 24 and 26. It should be understood that each layer of glass 24 and 26 can already be multi-layered transparent laminations. Furthermore, each glass piece may have a heat reflectance or optical filter and/or be appropriately tinted.

The finished laminated transparent or translucent sheet 14 can then be used and handled in much the same way as a standard architectural sheet of glass or plastic.

It should be noted that if a transparent resin material is used in place of the stainless steel substrate 30, deposition chambers for providing a transparent conductive oxide on the resinous substrate would be needed before the deposition chambers 56, 58 and 60. Furthermore, if a transparent substrate is used in place of a stainless steel substrate, there is no need to pass an aperture through the substrate but only through the semiconductive layers. Hence, an etching process can be used as a substitute for the lasers or mechanical piercing mechanism at station 70. In either case, the see-through or translucent property of a power generating sheet is accomplished without changing the deposition process as shown through stations 56 to 66. The integrity of the vacuum deposition chambers does not have to be compromised by either introducing or removing substrate material for etching or piercing processes. Furthermore, the translucent photovoltaic device 14 employs power generating film 28 which is made by the same production line that produces solid opaque power generating films without any modification to the processes. Such use provides for economy in the factory and streamlined inventory to produce a variety of different types of photovoltaic devices, depending on the particular needs.

It should also be understood that each photovoltaic device or architectural pane of glass as particularly shown in FIG. 2 can be interconnected or combined in series and parallel arrangements so as to satisfy any desired set of current-voltage-power requirements. The panels 22 can be interconnected in the same fashion as commercially available opaque laminated panels.

Other variations and modifications of the present invention are possible without departing from its scope and spirit as defined by the appended claims.

The embodiments of the invention in which an exclusive property or privilege is claimed are defined as follows:

1. A light transmissive photovoltaic device comprising:
    an electrically conductive substrate forming a first electrode;
    a plurality of layers of semiconductive material disposed on said substrate to form at least one photovoltaic cell;
    an electrically conductive second electrode disposed on a top layer of said semiconductive material; and
    a plurality of apertures passing through said semiconductive layers and said substrate to let a portion of incident light pass therethrough, each of said plurality of apertures having a diameter sufficiently small to cause diffraction of a substantial portion of said incident light passing through said device.

2. A photovoltaic device as defined in claim 1 further characterized by:
    said device being laminated between two optically transmissive rigid or semi-rigid sheets of material.

3. A photovoltaic device as defined in claim 1 further characterized by:
    said second electrode comprising strips of electrically conductive material on the top surface of said plurality of layers of semiconductive material and passing between the plurality of apertures.

4. A photovoltaic device as defined in claim 1 further characterized by:
    said second electrode comprising a layer of transparent electrically conductive material, said apertures also passing through said second electrode.

5. A light transmissive power generating sheet material including:
    a transparent substrate comprising a first, light transmissive, electrically conductive electrode;
    a photovoltaic semiconductor layered film having a top surface and a bottom surface and constructed to produce a voltage differential between its bottom surface and its top surface, when its top surface is exposed to incident light;
    said bottom surface being supported by said substrate and in electrical contact with said first electrode;
    an optically transmissive second electrode disposed on said top surface of said semiconductor layered film; and
    a plurality of apertures extending through said semiconductor layered film to let said light pass therethrough, said apertures being sized small enough to diffract most of said incident light passing therethrough.

6. A power generating sheet as defined in claim 5 further characterized by:
    said substrate being formed of a transparent resinous material and said first electrode being formed of a transparent conductive oxide material.

7. A power generating sheet as defined in claim 5 further characterized by:
    said second electrode comprising strips of electrically conductive material on said top surface of said semiconductor layered film positioned between the plurality of apertures.

8. A power generating sheet as defined in claim 5 further characterized by:
    said second electrode includes a layer of transparent electrically conductive material on said top surface of said semiconductor layered film.

* * * * *